United States Patent [19]

Koyanagi

[11] Patent Number: 4,970,685
[45] Date of Patent: Nov. 13, 1990

[54] SEMICONDUCTOR MEMORY DEVICE HAVING A DIVIDED BIT LINE STRUCTURE

[75] Inventor: Masaru Koyanagi, Tokyo, Japan

[73] Assignee: Kabushiki Kaisha Toshiba, Kawasaki, Japan

[21] Appl. No.: 298,133

[22] Filed: Jan. 18, 1989

[30] Foreign Application Priority Data

Jan. 19, 1988 [JP] Japan .................................. 63-8912

[51] Int. Cl.⁵ .......................... G11C 5/02; G11C 11/34
[52] U.S. Cl. ......................................... 365/51; 365/174
[58] Field of Search ................. 365/205, 207, 149, 51, 365/174, 189.02, 63

[56] References Cited

U.S. PATENT DOCUMENTS

| | | | |
|---|---|---|---|
| 4,351,034 | 9/1982 | Eaton, Jr. et al. | 365/205 X |
| 4,367,540 | 1/1983 | Shimohigashi | 365/51 |
| 4,546,457 | 10/1985 | Nozaki et al. | 365/51 |
| 4,590,588 | 5/1986 | Itoh et al. | 365/51 |
| 4,675,845 | 6/1987 | Itoh et al. | 365/51 |
| 4,777,625 | 10/1988 | Sakui et al. | 365/207 |
| 4,819,207 | 4/1989 | Sakui et al. | 365/222 X |

OTHER PUBLICATIONS

Taylor et al., "A 1-Mbit CMOS Dynamic Ram with a Divided Bitline Matrix Architecture," IEEE Journal of Solid State Circuits, vol. SC-20, No. 5, Oct. 85, pp. 894-902.

Primary Examiner—Stuart N. Hecker
Assistant Examiner—Michael A. Whitfield
Attorney, Agent, or Firm—Finnegan, Henderson, Farabow, Garrett, and Dunner

[57] ABSTRACT

A semiconductor memory device includes an array of memory cells arranged in rows and columns, a plurality of divided bit line pairs connecting the memory cells, the divided bit line pairs extending along a given column of memory cells, and a pair of main bit lines extending substantially parallel to the divided bit line pairs. The semiconductor memory device further comprises a plurality of sense amplifiers, each provided for two adjacent divided bit line pairs, a plurality of first switching circuit, each of which is provided for connecting each sense amplifier to either of the two adjacent divided bit line pairs, and a plurality of second switching circuit for transferring the output signal of each the sense amplifier to the pair of main bit lines.

6 Claims, 12 Drawing Sheets

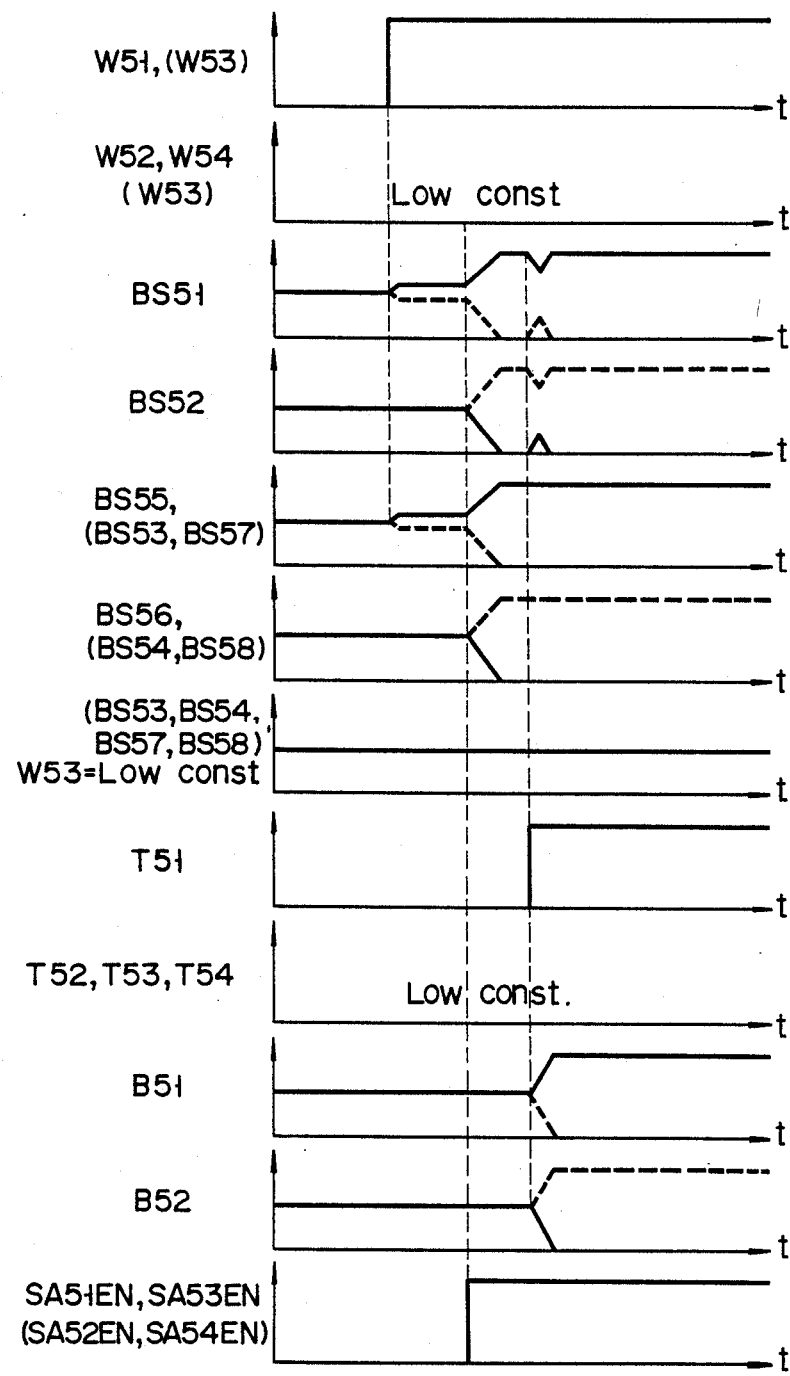
F I G. 8

SEMICONDUCTOR MEMORY DEVICE HAVING A DIVIDED BIT LINE STRUCTURE

BACKGROUND OF THE INVENTION

1. Field of the Invention

The present invention relates to a semiconductor memory device, and more particularly, to a semiconductor memory device having a divided bit line structure.

2. Description of the Related Art

A semiconductor memory device of large memory capacity contains a correspondingly large number of memory cells connected to bit lines. However, using a large number of memory cells has the effect of causing a large stray capacitance around the bit lines, which impedes the data read operation to the memory cells.

To cope with such data read retardation, there has recently been developed a semiconductor memory device having a divided bit line structure as shown in FIG. 1. In the memory device of FIG. 1, sense amplifier 11 is connected at both ends to a pair of main bit lines B11 and B12. The paired main bit lines are respectively connected through transfer switches S11 and S12 to paired divided bit lines BS11 and BS12, and through transfer switches S13 and S14 to paired divided bit lines BS13 and BS14. Transfer control line T11 is connected to switches S11 and S12, which are for controlling data transfer between paired main bit lines B11 and B12 and paired divided bit lines BS11 and BS12, and transfer control line T12 is connected to switches S13 and S14, which are for controlling data transfer between paired main bit lines B11 and B12 and paired divided bit lines BS13 and BS14. When transfer control line T11 is energized, switches S11 and S12 are turned on to electrically connect main bit lines B11 and B12 to paired divided bit lines BS11 and BS12, respectively. When transfer control line T12 is energized, switches S13 and S14 are turned on to electrically connect main bit lines B11 and B12 to paired divided bit lines BS13 and BS14, respectively.

Paired divided bit lines BS11 and BS12 are coupled with memory cells C11 and C12, while paired divided bit lines BS13 and BS14 are coupled with memory cells C13 and C14.

When one of word lines W11 to W14 is selected, the memory cells connected to the selected word line are driven so that data stored in the driven memory cells is transferred to the divided bit line. When the control line of a switch connecting a divided bit line to a related main bit line is selected, the data on the divided bit line is transferred to the main bit line. The data of the selected memory cell appears in the form of a minute potential difference between the paired main bit lines B11 and B12, and by amplifying the potential difference, by means of sense amplifier 11, the logical state of the data, viz., "1" or "0", can be determined.

Since the memory cells in a column of such a divided bit line system ar allotted to a plurality
e of divided bit line pairs, the number of memory cells connected to one pair of divided bit lines can be reduced, to cause a corresponding reduction in the stray capacitance around main bit line pair B11, B12, and an increase in the rate at which data can be read.

In the divided bit line system, however, a minute amount of charge from the memory cell is distributed among the divided bit line and the main bit line, so that an amount of charge transferred from the memory cell to the main bit line is extremely small. Therefore, if main bit lines are too long, a desired data transfer rate cannot be obtained. Thus, the divided bit line system can not use a long main bit lines and consequently the number of divided bit line pairs which can be connected to the paired main bit lines is limited.

An additional disadvantage of the conventional divided bit line system is that a large chip area is required for the bit line wiring, because the divided bit line pair and the main bit line pair must be provided for the memory cells in one column of the memory cell array.

SUMMARY OF THE INVENTION

Accordingly, an object of the present invention is to provide a semiconductor memory device by mean of which the wiring layout of bit lines can be simplified and the chip area required for wiring reduced, and which provides a variety of operating functions.

According to the present invention, there is provided a semiconductor memory device comprising: an array of memory cells arranged in rows and columns; a plurality of divided bit line pairs connecting the memory cells, the divided bit line pairs extending along a given column of memory cells; a pair of main bit lines extending substantially parallel to the divided bit line pairs and connected to data input/output lines, a plurality of sense amplifiers, each provided for two adjacent divided bit line pairs; a plurality of first switching means, each of which is provided for connecting each sense amplifier to either of the two adjacent divided bit line pairs; and a plurality of second switching means for transferring the output signal of each sense amplifier to the pair of main bit lines.

The sense amplifiers are connected to divided bit line pairs which have less stray capacitance than the main bit line pairs. Since the sensitivity of each sense amplifier is inversely proportional to the stray capacitance of any bit lines to which it is coupled, it is greater than if it is connected to the main bit line pairs. Further, since sense amplifiers are provided, each for two adjacent divided bit line pairs, they occupy less pattern area than the case where each of them is provided for only one divided bit line pair. Hence, the main bit lines can be lengthened, whereby not only the lines used in the memory cell array can be freely laid out, but also the integration density of the cell array can increase.

BRIEF DESCRIPTION OF THE DRAWINGS

FIG. 8 is a timing chart useful in explaining the operations of the switches provided in the semiconductor memory device shown in FIG. 7;

DETAILED DESCRIPTION OF THE PREFERRED EMBODIMENTS

A number of specific preferred embodiments of a semiconductor memory device according to the present invention will now be described, with reference to the accompanying drawings.

Figure 1:
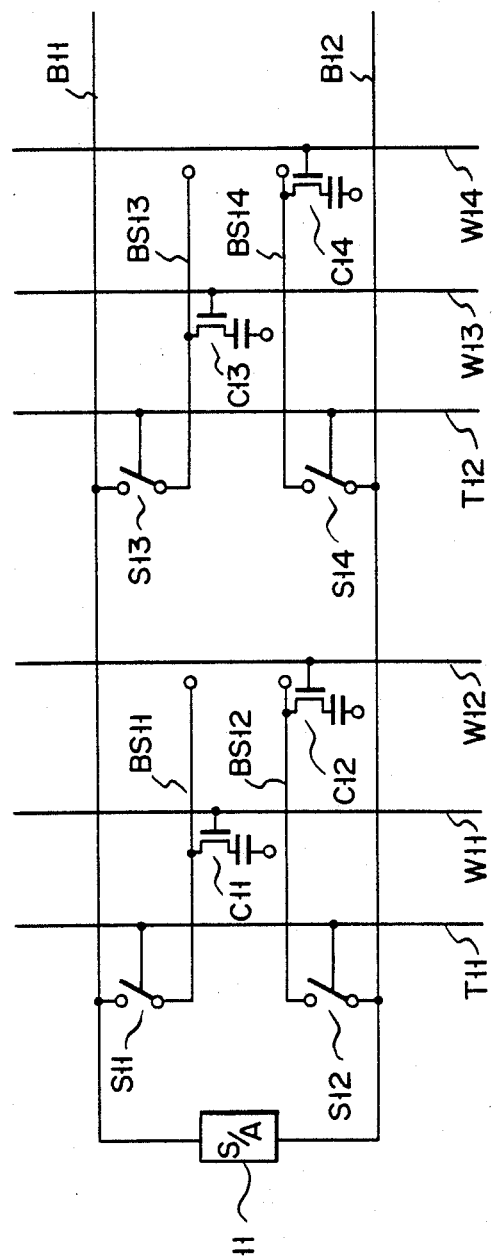
FIG. 1 is a circuit diagram showing a conventional semiconductor memory device having a divided bit line structure.
Figure 2:
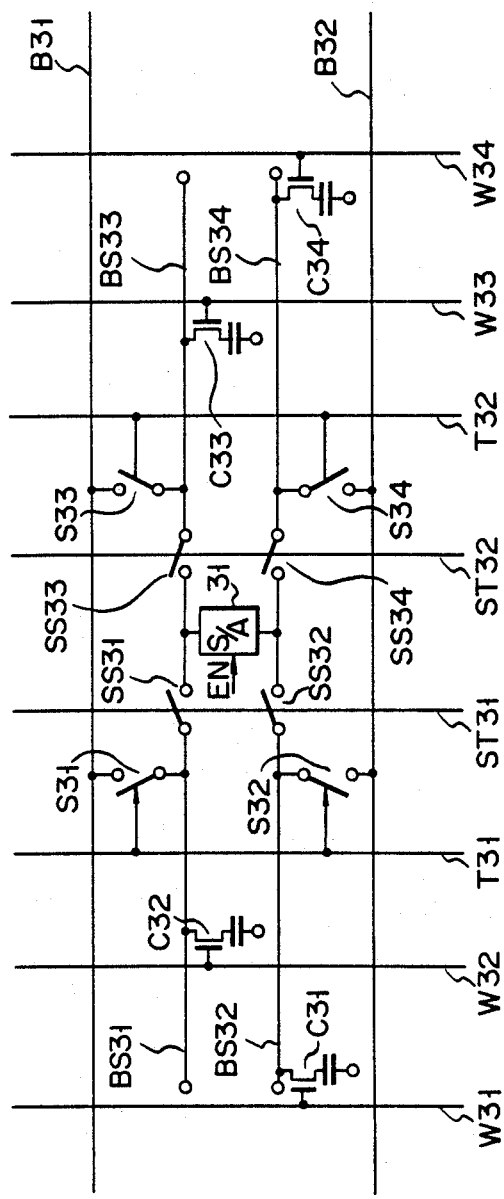
FIG. 2 is a circuit diagram showing a semiconductor memory device having a divided bit line structure according to a first embodiment of the present invention.

A first embodiment of a semiconductor memory device according to the present invention is illustrated in block form in FIG. 2. For ease of explanation, the illustrated arrangement of the memory device represents that of only one column of a matrix array of memory cells. Paired main bit lines B31 and B32 are respectively connected at first ends to I/O and I/O bar lines (not shown) for inputting data to and outputting data from a related computer. Main bit lines B31 and B32 are respectively connected to paired divided bit lines BS31 and BS32 to switches S31 and S32, and to paired divided bit lines BS33 and BS34 to switches S33 and S34. The main bit line pair B31, B32 and the divided bit line pairs BS31, BS32 and BS33, BS34 are laid out substantially in parallel with each other.

Upon energization of transfer control line T31, switches S31 and S32 are turned on, to allow data transfer between divided bit line pair BS31 and BS32 and main bit line pair B31 and B32. Upon energization of transfer control line T32, switches S33 and S34 are turned on, to allow data transfer between divided bit line pair BS33 and BS34 and main bit line pair B31 and B32.

Sense amplifier 31 is provided between divided bit line pair BS31 and BS32 and another divided bit line pair BS33 and BS34, and is used by both divided bit line pairs. Switches SS31 and SS32 are connected between paired divided bit lines BS31 and BS32, and sense amplifier 31, and switches SS33 and SS34 are connected between paired divided bit lines BS33 and BS34, and sense amplifier 31.

Divided bit lines BS31 and BS32 are coupled with memory cells C31 and C32, and divided bit lines BS33 and BS34 are coupled with memory cells C33 and C34, respectively. Memory cells C31 to C34 are each made up of a transistor and a capacitor, and are selectively specified by word lines W31 to W34, respectively.

Figure 3:
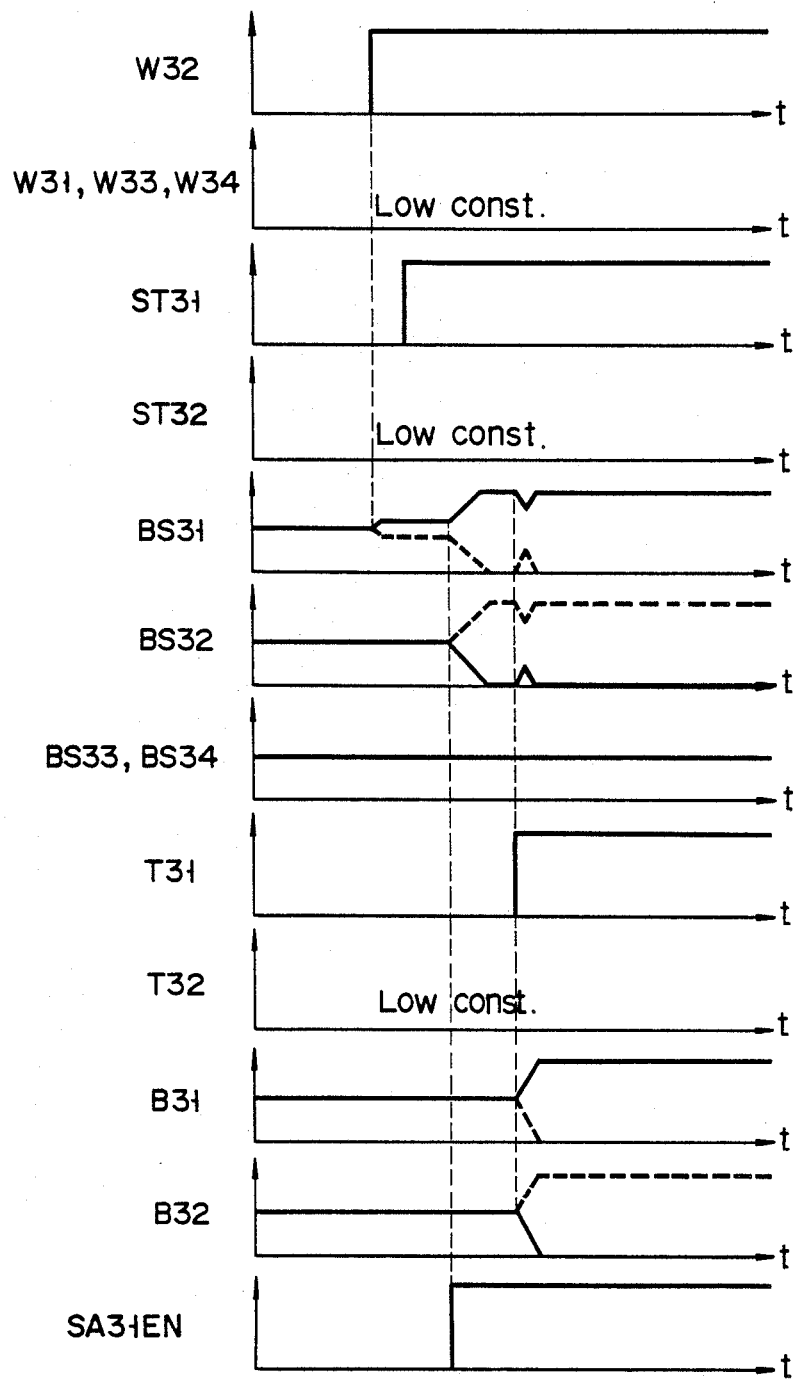
FIG. 3 is a timing chart useful in explaining the operations of the switches provided in the semiconductor memory device shown in FIG. 2.

An operation of the memory device thus arranged will now be described, with reference to FIG. 3, showing a timing chart, the operation to be described relating to the case where word line W32 is energized.

When word line W32 is energized, memory cell C32 is driven and the data stored therein changes the potential on divided bit line BS31. When the stored data is "1", the potential on divided bit line BS31 rises as indicated by a continuous line, while when it is "0", the potential falls as indicated by a broken line. In either case, control line ST31 is subsequentially set at "H" level, and switches SS31 and SS32 are turned on to connect the pair of divided the lines BS31 and BS32 to sense amplifier 31. Then, enable signal SABIEN drives sense amplifier 31, so that the amplifier 31 amplifies a minute amount of data charge derived from memory cell C32. As a result, the potential on divided bit line BS31 is set at "1" or "0" depending on the data stored in memory cell C32. On the other hand, the potential on divided bit line BS32 is set in a logical state which is the inverse of that on divided bit line BS31. Subsequently, control line T31 is energized and switches S31 and S32 are turned on to connect paired divided bit lines BS31 and BS32 respectively to paired main bit lines B31 and B32. As a result, the potentials on divided bit lines BS31 and BS32 are transferred to main bit lines B31 and B32. Incidentally, it is only needed that the energization of control line ST31 is prior to the driving of sense amplifier 31.

It should be noted here that in the memory device under discussion, it is only the potential on the divided bit line pair that the sense amplifier 31 amplifies. The divided bit line pair has less stray capacitance. This indicates that it is possible to set the divided bit line potential at "1" or "0" at high speed, with the result that data can be read out at high speed even if long main bit line pair B31 and B32 is used, and from this, it follows that there is no longer a limit to the number of divided bit lines which can be connected to any one pair of main bit lines. It should further be noted that, as shown in FIG. 2, since sense amplifiers are provided, each for two adjacent divided bit line pairs, they occupy less pattern area than the case where each of them is provided for only one divided bit line pair. Hence, the integration density of the cell array can increase.

Figure 4:
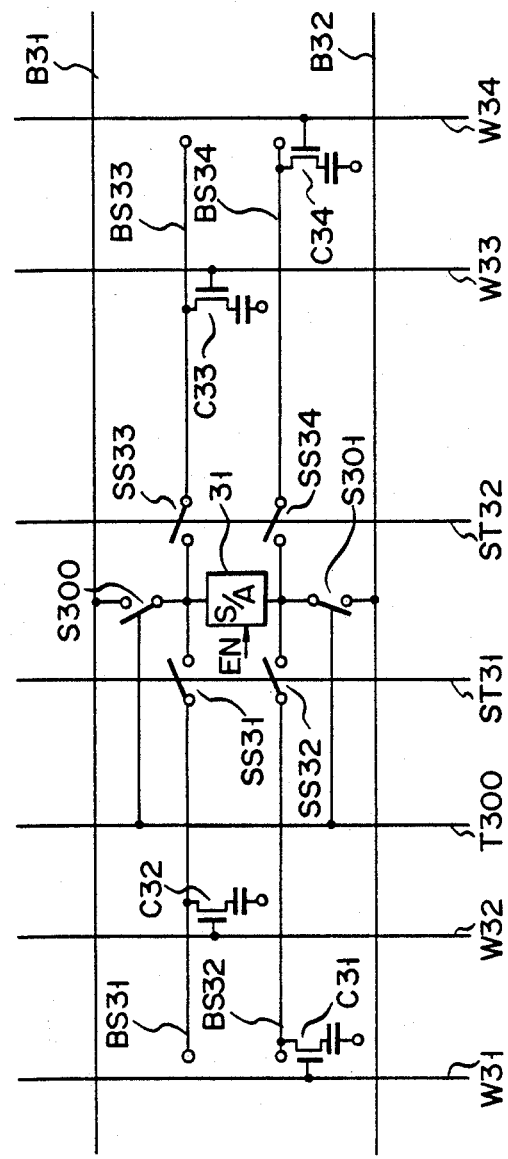
FIG. 4 is a circuit diagram showing a semiconductor memory device having a divided bit line structure according to a second embodiment of the present invention.

Turning now to FIG. 4, an arrangement of a second embodiment of a semiconductor memory device according to the present invention is shown. As in the memory device of the first embodiment, the second embodiment has the feature wherein a single sense amplifier is provided for each two pairs of divided bit lines arrayed in a row. The major difference between the second embodiment and the first embodiment is that two switches S300 and S301 ar used in place of four switches S31 to S34.

As is shown in FIG. 4, switch S300 is provided between one end of sense amplifier 31 and main bit line B31, and switch S301 is provided between the other end of sense amplifier 31 and main bit line B32. These switches are controlled through control line T300 which is set at "H" level when any of word lines W31 to W34 is energized.

Beneficial effects comparable with those of the first embodiment can be attained by the second embodiment.

Figure 5:
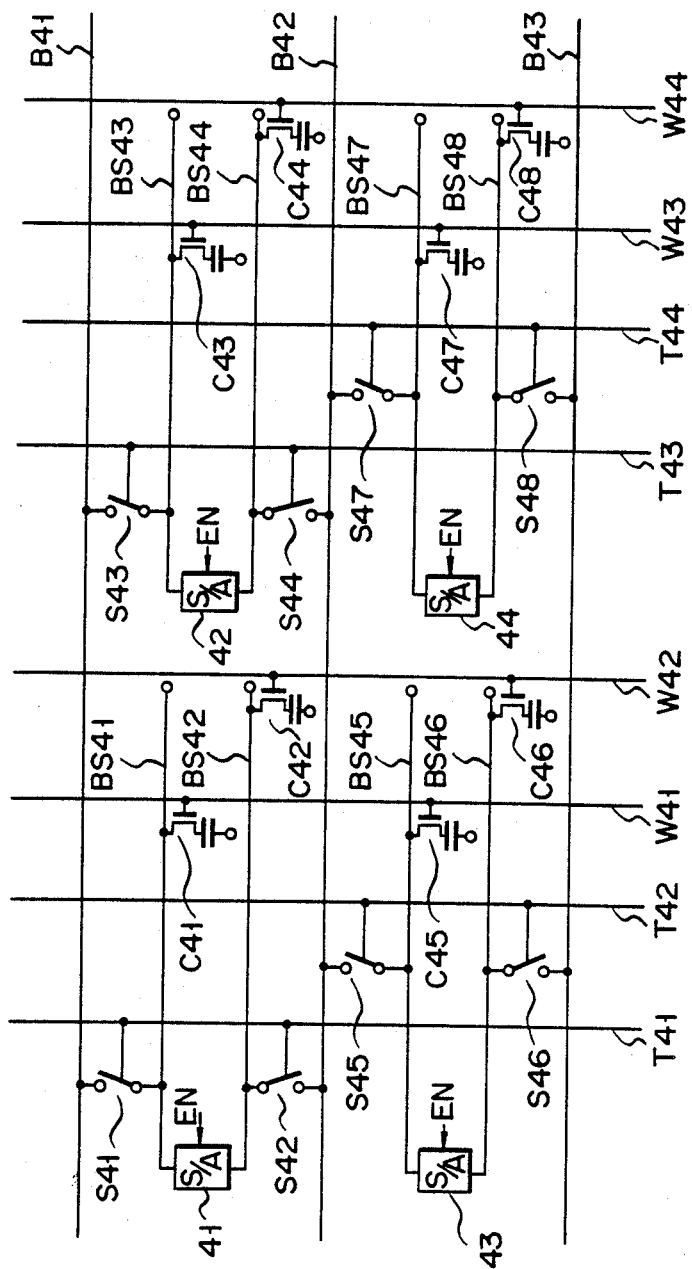
FIG. 5 is a circuit diagram showing a semiconductor memory device having a divided bit line structure according to a third embodiment of the present invention.

A third embodiment of a semiconductor memory device according to the present invention is illustrated in FIG. 5. The memory device of this embodiment is arranged such that each of the sense amplifiers is provided for one divided bit line pairs arrayed in a column, and one main bit line is commonly used by two adjacent columns. To be more specific, in an Nth column, sense amplifier 41 is provided for paired divided bit lines BS41 and BS42, and sense amplifier 42 is provided for paired divided bit lines BS43 and BS44. In an (N+1)th column, sense amplifier 43 is provided for paired divided bit lines BS45 and BS46, and sense amplifier 4 is provided for paired divided bit lines BS47 and BS48.

Main bit line B41 is connected to divided bit line BS41 through switch S41 that is controlled by transfer control line T41, and to divided bit line BS43 through switch S43 that is controlled by transfer control line T43. Another main bit line B42 is connected to divided bit line BS42 through switch S42 that is controlled by transfer control line T41, and to divided bit line BS44 through switch S44 that is controlled by transfer control line T43. And also, the main bit line B42 is connected to divided bit line BS45 through switch S45 that is controlled by transfer control line T42, and to divided bit line BS47 through switch S47 that is controlled by transfer control line T44. A further main bit line B43 is connected to divided bit line BS46 through switch S46 that is controlled by transfer control line T42, and to divided bit line BS48 through switch S48 that is controlled by transfer control line T44.

Paired divided bit lines BS41 and BS42 are coupled with memory cells C41 and C42; paired divided bit lines BS43 and BS44, to memory cells C43 and C44; paired divided bit lines BS45 and BS46, to memory cells C45 and C46; and paired divided bit lines BS47 and BS48, to memory cells C47 and C48. Memory cells C41 and C45 are driven by word line W41; memory cells C42 and C46, by word line W42; memory cells C43 and C47, by word line W43; and memory cells C44 and C48, by word line W44.

Figure 6:
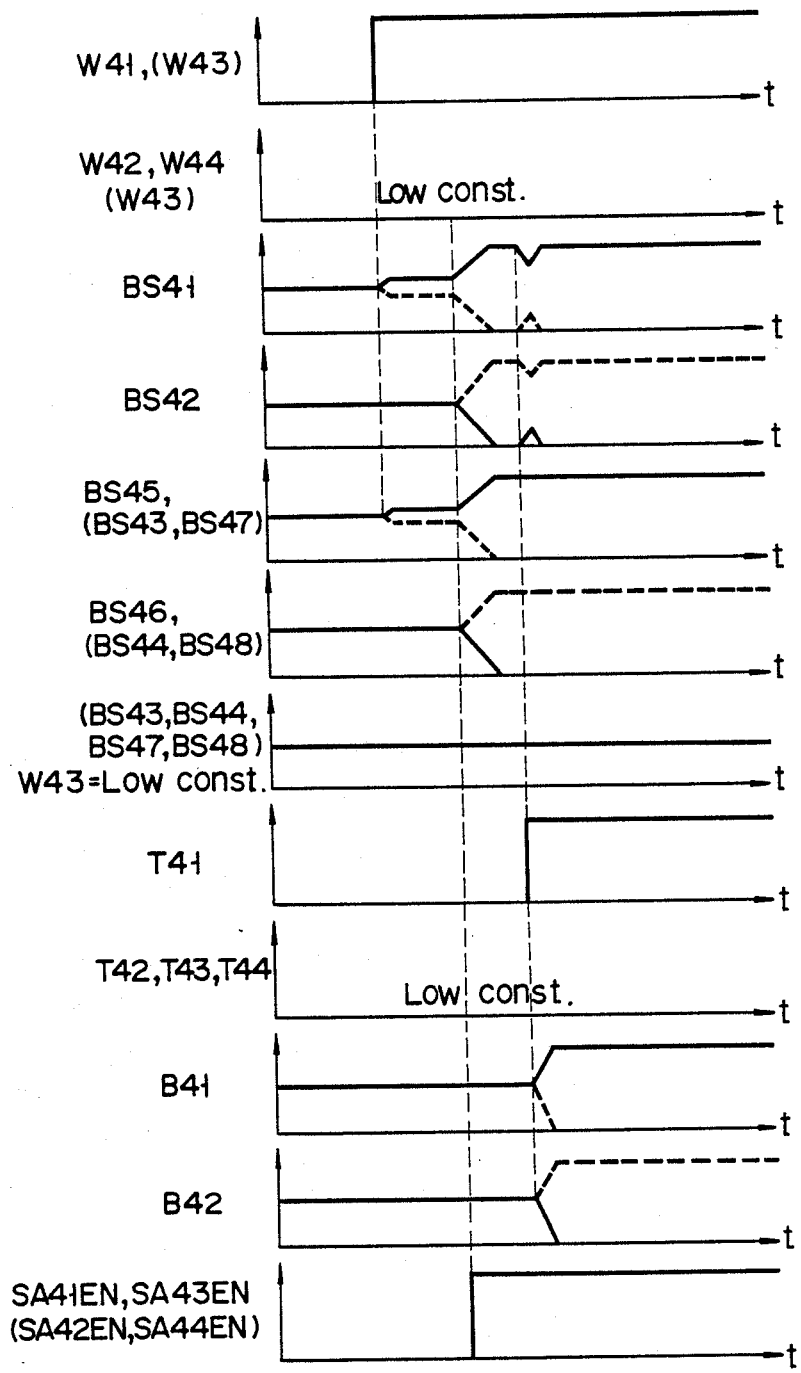
FIG. 6 is a timing chart useful in explaining the operations of the switches provided in the semiconductor memory device shown in FIG. 5.

The operation of the memory device thus arranged, when word line W41 is energized, will be described with reference to a timing chart shown in FIG. 6.

When word line W41 is energized, memory cells C41 and C45 are driven, so that the data stored therein change the potentials on divided bit lines BS41 and BS45. In case that the data stored in those cells are "1", for example, the potentials rise as indicated by solid lines. In case that the data stored in those cells are "0", for example, the potentials fall as indicated by broken lines. In either case, enable signals SA41EN and SA43EN drive subsequentially sense amplifiers 41 and 43, which in turn each amplify a minute amount of data charge. As a result, the potential on bit line BS41 is set in "1" or "0" depending on the data stored in cell C41, while the potential on bit line BS42 of the counter part is set in a logical state which is an inverse to that on bit line BS41. Similarly, the potential on bit line BS45 is set in "1" or "0" depending on the data stored in cell C45, while the potential on bit line BS46 of the counter part is set in a logical state which is an inverse to that on bit line BS45. Succeedingly, either of control lines T41 and T42 is energized. If control line T41 is energized, switches S41 and S42 are turned on to connect divided bit line pair BS41 and BS42 to main bit line pair B41 and B42. Under this condition, the potentials on divided bit lines BS41 and BS42 are transferred to main bit lines B41 and B42.

With such an arrangement in which a single main bit line is commonly used by two adjacent columns, e.g., Nth column and (N+1)th column. Each of these two column includes a memory cell commonly driven by one word line. In this arrangement, a required pattern area is remarkably reduced. This effect cannot be obtained by the conventional memory device in which a sense amplifier is provided for the main bit line pair. It cannot be obtained till the memory scheme using the sense amplifiers for the divided bit lines is proposed.

The memory scheme in which one sense amplifier is used by two divided bit line pairs in a column as shown in FIG. 2 or FIG. 4, may be applied for the memory scheme of FIG. 5. Such an application further reduces a required pattern area.

In the memory scheme that one main bit line is commonly used by two adjacent columns, the data on the divided bit line pair in selected a column is read out onto the main bit line pair, while the memory cells connecting to the divided bit line pairs in the columns not selected are equivalently refreshed.

In a write mode, data can be written into a plurality of memory cells by simultaneously turning on a plurality of switches provided between the divided bit line pair and the main bit line pair.

Figure 7:
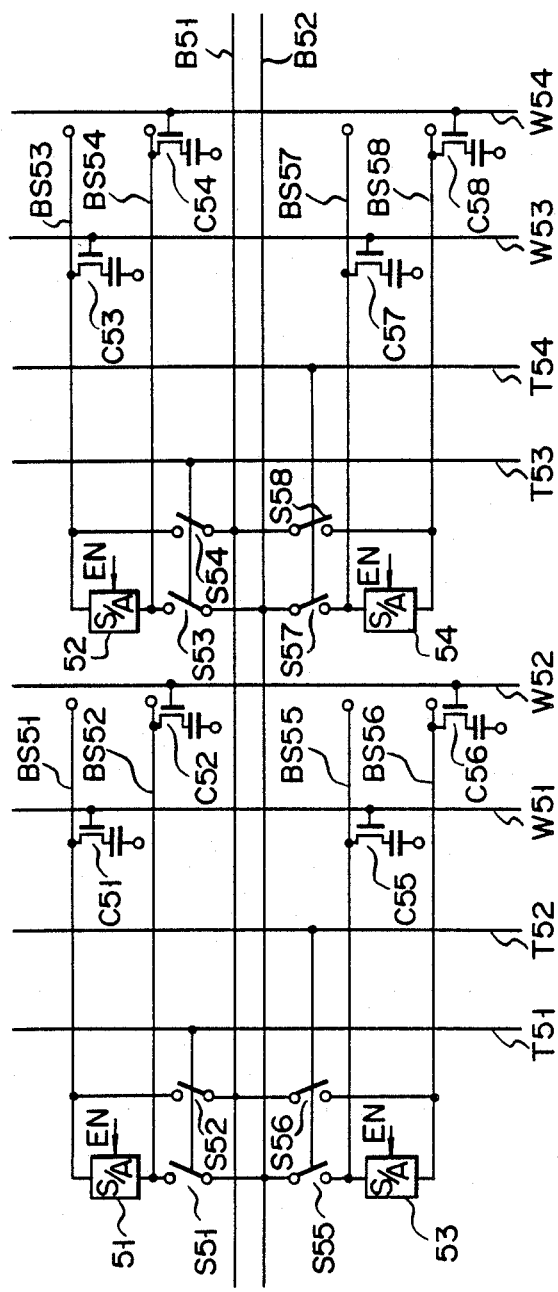
FIG. 7 is a circuit diagram showing a semiconductor memory device having a divided bit line structure according to a fourth embodiment of the present invention.

FIG. 7 shows an arrangement of a semiconductor memory device according to a fourth embodiment of the present invention. In the memory scheme, one main bit line pair is commonly used by two adjacent columns.

In the figure, paired divided bit lines BS51 and BS52, and BS53 and BS54 are contained in the Nth column, and paired divided bit lines BS55 and BS56, and BS57 and BS58, in the adjacent (N+1)th column. A pair of main bit lines B51 and B52 is extending parallel to those two adjacent columns, and commonly used by them.

Main bit line B51 is connected to divided bit line BS51 in the Nth column via switch S52 controlled by transfer control line T51, and to divided bit line BS53 through switch S54 controlled by control line T53. And also, main bit line B51 is connected to divided bit line BS56 in the (N+1)th column via switch S56 controlled by transfer control line T52, and to divided bit line BS58 through switch S58 controlled by control line T54 Similarly, main bit line B52 is connected to divided bit line BS52 in the Nth column via switch S51 controlled by transfer control line T51, and to divided bit line BS54 through switch S53 controlled by control line T53. And also, main bit line B52 is connected to divided bit line BS55 in the (N+1)th column via switch S55 controlled by transfer control line T52, and to divided bit line BS57 through switch S57 controlled by control line T54.

Divided bit lines BS51 and BS52 are connected to memory cells C51 and C52; divided bit lines BS53 and BS54, to memory cells C53 and C54; divided bit lines BS55 and BS56, to memory cells C55 and C56; and divided bit lines BS57 and BS58, to memory cells C57 and C58. Memory cells C51 and C55 is driven by word line W51; memory cells C52 and C56, by word line W52; memory cells C53 and C57, by word line W53; and memory cells C54 and C58, by word line W54.

The operation of the memory device thus arranged, when word line W51 is energized, will be described with reference to a timing chart shown in FIG. 8.

When word line W51 is energized, memory cells C51 and C55 are driven, so that the data stored therein changes the potentials on divided bit lines BS51 and BS55. In case that the data stored in those cells are "1", for example, the potentials rise as indicated by solid lines. In case that the data stored in those cells are "0", for example, the potentials fall as indicated by broken lines. In either case, enable signals SA51EN and SA53EN drive subsequentially sense amplifiers 51 and 53, which in turn each amplify a minute amount of data charge. As a result, the potential on bit line BS51 is set in "1" or "0" depending on the data stored in cell C51, while the potential on bit line BS52 of the counter part is set in a logical state which is an inverse to that on bit line BS51. Similarly, the potential on bit line BS55 is set in "1" or "0" depending on the data stored in cell C55, while the potential on bit line BS56 of the counter part is set in a logical state which is an inverse to that on bit line BS55. Succeedingly, either of control lines T51 and T52 is energized. If control line T51 is energized, switches S51 and S52 are turned on to connect divided bit line pair BS51 and BS52 to main bit line pair B51 and B52. Under this condition, the potentials on divided bit lines BS51 and BS52 are transferred to main bit lines B51 and B52. The memory cell C55 in divided bit line BS55 is refreshed.

The above memory scheme using a pair of main bit lines for two columns more reduces a required pattern area than that of FIG. 5. Further, it reduces the number of column select switches to ½ that of the conventional memory device in which, a pair of column select switches is needed for one column. Accordingly, the number of column select lines connecting to a column decoder for controlling these switches is also reduced to ½. The reduced number of column select lines implies that the construction of the column decoder for driving them may be correspondingly simplified. This fact is very useful for the integrated circuits whose integration density will increase more and more.

Also in the memory scheme of FIG. 7, a single sense amplifier may be used for two divided bit line pairs, as shown in FIG. 2 or FIG. 4.

Figure 9:
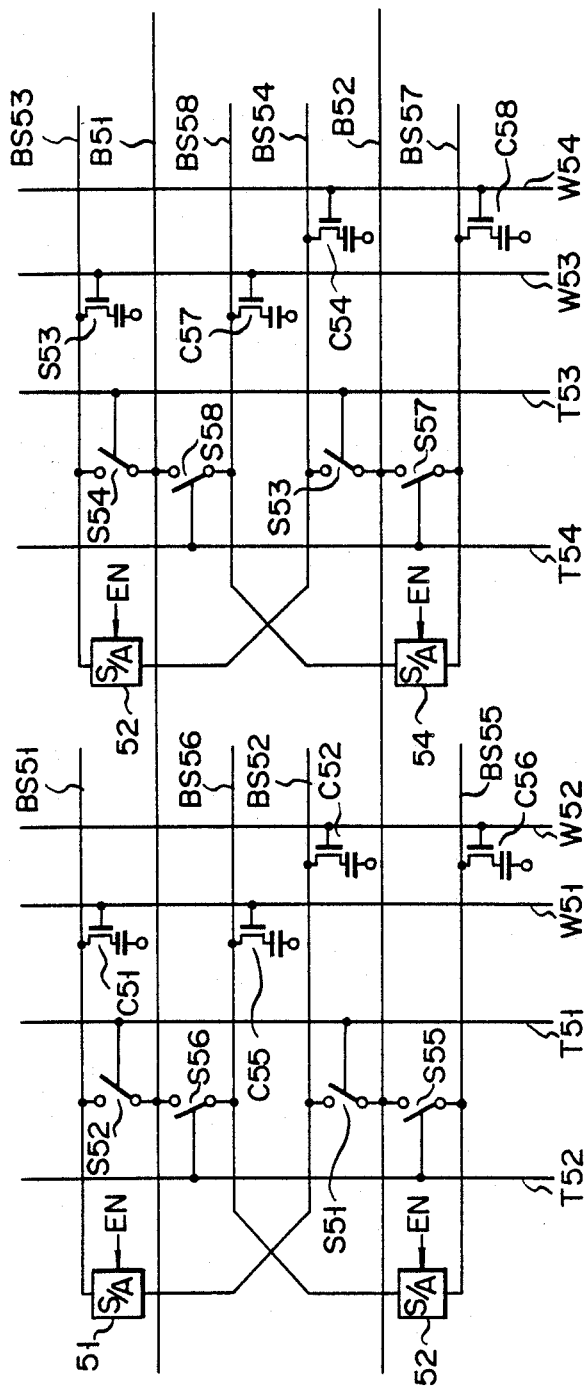
FIG. 9 is a circuit diagram showing a semiconductor memory device having a divided bit line structure according to a fifth embodiment of the present invention.

FIG. 9 shows a semiconductor memory device according to a fifth embodiment of the present invention. The memory device is a modification of the fourth embodiment of FIG. 7 in which a pair of main bit lines is used for two columns. In the semiconductor memory device, the divided bit line in the Nth column and the divided bit line in the (N+1)th column are alternately arranged with respect to the main bit line. The fourth embodiment thus arranged may attain substantially the same effects as those of the embodiment of FIG. 7.

Figure 10:
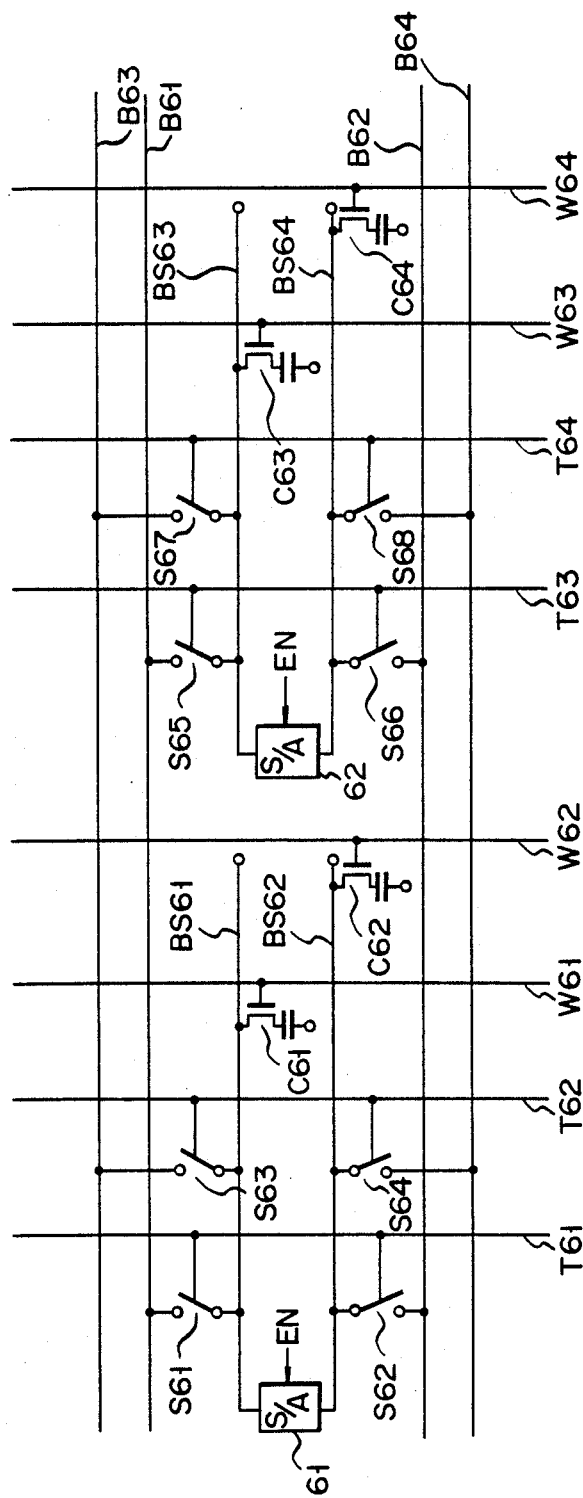
FIG. 10 is a circuit diagram showing a semiconductor memory device having a divided bit line structure according to a sixth embodiment of the present invention.

FIG. 10 shows a sixth embodiment of a semiconductor memory device according to the present invention, in which two pairs of main bit lines are arranged for one column, and each of divided bit line pairs in a column is selectably connected to either of the two main bit line pairs.

Paired divided bit lines BS61 and BS62 are connected to paired main bit lines B61 and B62 via switches S61 and S62 that is controlled by transfer control line T61, and also to paired main bit lines B63 and B64 through switches S63 and S64 that are controlled by transfer control line T62. Similarly, paired divided bit lines BS63 and BS64 are connected to paired main bit lines B61 and B62 via switches S65 and S66 that are controlled by transfer control line T63, and also to paired main bit lines B63 and B64 through switches S67 and S68 that are controlled by transfer control line T64.

Figure 11:
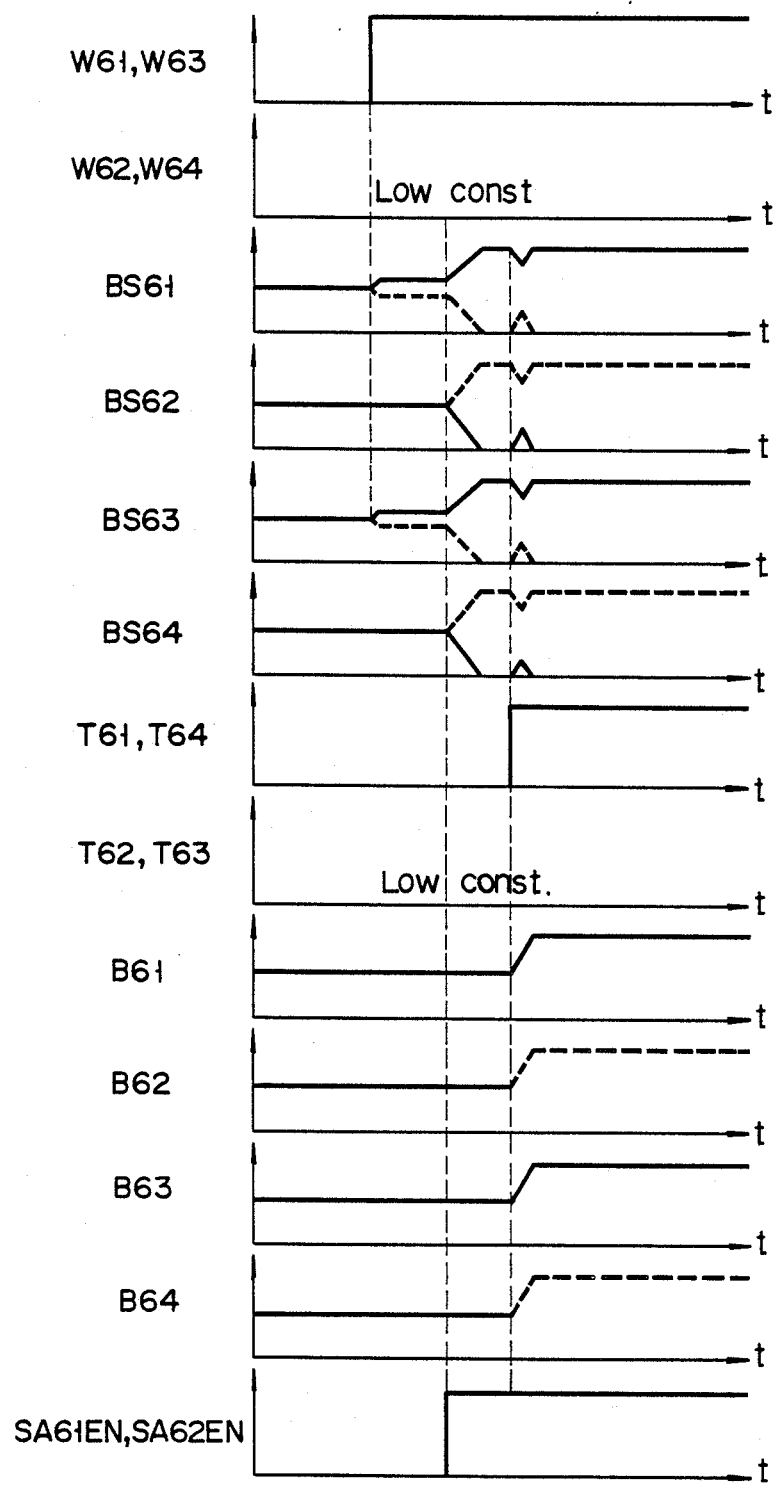
FIG. 11 is a timing chart useful in explaining the operations of the switches provided in the semiconductor memory device shown in FIG. 10.

The operation of the memory device thus arranged, when word lines W61 and W63 are energized, will be described with reference to a timing chart shown in FIG. 11.

When word lines W61 and W63 are energized, memory cells C61 and C63 are driven, so that the data stored therein changes the potentials on divided bit lines BS61 and BS63. In case that the data stored in those cells are "1", for example, the potentials rise as indicated by solid lines. In case that the data stored in those cells are "0", for example, the potentials fall as indicated by broken lines. In either case, enable signals SA61EN and SA62EN drive subsequently sense amplifiers 61 and 62, which in turn amplify the minute amounts of data charge from memory cells C61 and C63. As a result, the potential on bit line BS61 is set in "1" or "0" depending on the data stored in cell C61, while the potential on bit line BS62 of the counter part is set in a logical state which is an inverse to that on bit line BS61. Similarly, the potential on bit line BS63 is set in "1" or "0" depending on the data stored in cell C63, while the potential on bit line BS64 of the counter part is set in a logical state which is an inverse to that on bit line BS63. Succeedingly, control lines T61 and T64 are energized, and switches S61, S62, S67, and S68 are turned on. Under this condition, divided bit line pair BS61 and BS62 are connected to main bit line pair B61 and B62, and divided bit lines BS63 and BS64 are connected to main bit line pair B63 and B64. As a result, the potentials on divided bit line pair BS61 and BS62 are transferred to main bit line pair B61 and B62, and the potentials on divided bit lines BS63 and BS64 are transferred to main bit lines B63 and B64.

In the semiconductor memory device thus arranged, data can be simultaneously read out from two pairs of divided bit lines in a column. Alternatively, when the data read out operation is being performed between the first divided bit line pair and the first main bit line pair, data may be written from the second main bit line pair into the memory cells of the second divided bit line pair. The memory scheme as shown in FIG. 10 allows use of the memory scheme a single main bit line or a single pair of bit lines for two adjacent columns as shown in FIG. 5 or FIG. 7. Additionally, it allows use of the memory scheme using a single sense amplifier for two divided bit line pairs.

Figure 12:
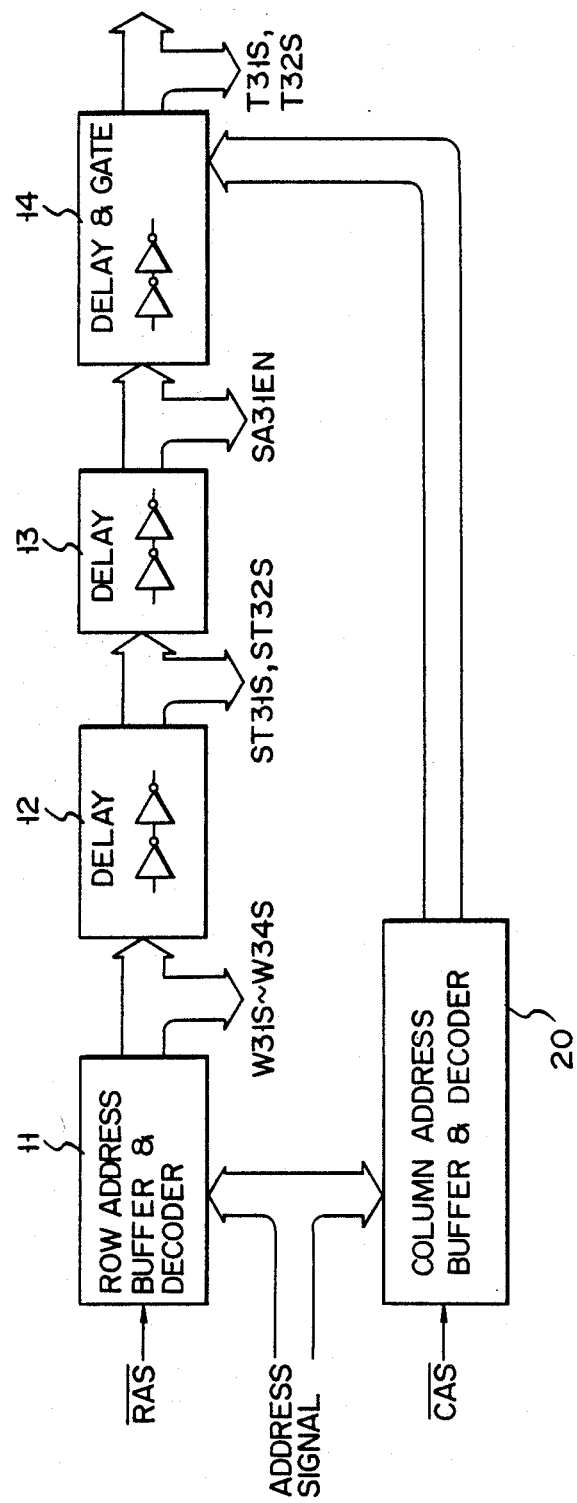
FIG. 12 is a block diagram showing a circuit for generating switch control signals used in the semiconductor memory devices of the first to sixth embodiments.

FIG. 12 shows a block diagram of a signal generator for generating various signals that are used in the memory devices of the first to sixth embodiments, such as a word line energizing signal, control line energizing signal and sense amplifier energizing signal. The signal generator illustrated is incorporated into the semiconductor memory device according to the first embodiment of FIG. 2.

Row address buffer/decoder 11 receives a row address signal, and decodes it. The decoding operation is executed at the timing of activating row address strobe signal $\overline{RAS}$. Column address buffer/decoder 20 receives a column address signal and decodes it. The decoding operation is executed at the timing of activating column address strobe signal $\overline{CASE}$. Row address buffer/decoder 11, on the basis of the result of decoding, selectively sets in "H" level word line energizing signals W31S to W34S corresponding to word lines W31 to S34. Word line energizing signals W31S to W34S are delayed by delay circuit 12 by predetermined times, and then are output as energizing signals ST31S and ST32S for control lines ST31 and ST32. When energizing signal W31S or W32S is set in "H" level, for example, control line energizing signal ST31 rises to "H" level, from "L" level after a predetermined period of time. At this time, energizing signal ST32 remains "L" level.

Energizing signals ST31S and ST32S, after delayed by delay circuit 13, are transferred to gate 14, and is also output as enable signal SA31EN for use in sense amplifier 31. Delay/gate circuit 14 further delays signals ST31S and ST32S. The delayed signal is gated by a column select signal outputted from column address buffer/decoder 20. Specifically, when column select signal selects the Nth column, circuit 14 produces energizing signals T31S and T32S for control lines T31 and T32. In this case, when energizing signal ST31 is in "H" level, signal T31S becomes "H" in logical level. When signal ST32 is "H" level, signal T32S becomes "H" level.

While the signal generator is incorporated into the first embodiment, it is evident that it may be applied to other embodiments.

What is claimed is:

1. A semiconductor memory deice having data input/output lines, comprising:
    an array of memory cells arranged in rows and columns;
    a plurality of divided bit line pairs connecting the memory cells, said divided bit line pairs extending along a given column of memory cells;
    a pair of main bit lines extending substantially parallel to the divided bit line pairs and connected to data input/output lines;
    a plurality of sense amplifiers, each producing an output signal at an output terminal, one of said sense amplifiers being arranged between each two adjacent divided bit line pairs;
    a plurality of first switching means, each being provided for connecting one of the sense amplifiers to a selected one of the two adjacent divided bit line paris; and
    a plurality of second switching means for transferring the output signal of each of said sense amplifiers to said pair of main bit lines after said first switching means connects said sense amplifier to said selected one of the two adjacent divided bit line paris.

2. A semiconductor memory device according to claim 1, in which each of said second switching means is arranged between a respective one of said divided bit line paris and said main bit line pair.

3. A semiconductor memory device according to claim 1, in which each of said second switching means is arranged between the output terminal of a respective one of said sense amplifiers and said main bit line pair.

4. A semiconductor memory device having data input/output lines, comprising:
    an array of memory cells arranged in rows and columns;
    a plurality of first divided bit line pairs extending along an Nth column of memory cells, and connected to the memory cells of the Nth column;
    a first pair of main bit lines including first and second main bit lines, extending substantially parallel to said first divided bit line paris, and connected to data input/output lines;
    a plurality of first sense amplifiers, each producing an output signal at an output terminal, one f said first sense amplifiers being provided for each of said first divided bit line paris;
    a plurality of first switch means for transferring the output signal of each of said first sense amplifiers to said first pair of main bit lines;
    a plurality of second divided bit line paris extending along an (N+1)th column of memory cells, and connected to the memory cells of the (N+1)th column;
    a second pair of main bit lines including said second main bit line and a third main bit line, extending substantially parallel to said second divided bit line paris, and connected to said data input/output lines;
    a plurality of second sense amplifiers, each producing an output signal at an output terminal, one of said second sense amplifiers being provided for one of said second divided bit line paris; and
    a plurality of second switch means for transferring the output signal of each of said second sense amplifier to said second pair of main bit lines.

5. A semiconductor device having data input/output lines, comprising:
    an array of memory cells arranged in rows and columns;
    a plurality of first divided bit line paris extending along an Nth column of said memory cells, and connected to the memory cells of the Nth column;
    a plurality of second divided bit line pairs extending along an (N+1)th column of said memory cells, and connected to said memory cells of the (N+1)th column;
    a pair of main bit lines having first and second main bit lines, being arranged between said first divided bit line paris and said second divided bit line paris, extending substantially parallel to said first divided bit line paris and to said second divided bit line paris, and connected to said data input/output lines;
    a plurality of first sense amplifiers, each producing an output signal at an output terminal, one of said first sense amplifiers being provided for each of said first divided bit line paris;
    a plurality of first switch means for transferring the output signal of each of said first sense amplifiers to said pair of main bit lines;
    a plurality of second sense amplifiers, each producing an output signal at an output terminal, one of said second sense amplifiers being provided for one of said second divided bit line paris; and
    a plurality of second switch means for transferring the output signal of each of said second sense amplifiers to said pair of main bit lines.

6. A semiconductor memory device having data input/output lines, comprising:
    an array of memory cells arranged in rows and columns;
    a plurality of divided bit line paris connecting the memory cells, said divided bit line paris extending along a given column of memory cells;
    first and second main bit line paris extending substantially parallel to the divided bit line paris and connected to data input/output lines;
    a plurality of sense amplifiers, each producing an output signal at an output terminal, and one of said sense amplifiers being provided for each of said divided bit line paris;
    a plurality of first switching means for transferring the output signal of each of said sense amplifiers to said first main bit line pair; and
    a plurality of second switching means for transferring the output signal of each of said sense amplifiers to said second main bit line pair.

* * * * *

UNITED STATES PATENT AND TRADEMARK OFFICE
CERTIFICATE OF CORRECTION

PATENT NO. : 4,970,685
DATED : November 13, 1990
INVENTOR(S) : Masaru Koyanagi

It is certified that error appears in the above-identified patent and that said Letters Patent is hereby corrected as shown below:

Column 3, Line 38, change "to" to --through-- (first occurence);
Column 3, Line 39, change "to" to --through--;
Column 4, Line 10, change "SABIEN" to --SA31EN--;
Claim 1, Column 9, Line 11, change "deice" to --device--;
Claim 1, Column 9, Line 29, change "paris" --pairs--;
Claim 1, Column 9, Line 34, change "paris" to --pairs--;
Claim 2, Column 9, Line 38, change "paris" to --pairs--;
Claim 4, Column 9, Line 53, change "paris" to --pairs--;
Claim 4, Column 9, Line 56, change "f" to --of--;
Claim 4, Column 9, Line 58, change "paris" to --pairs--;
Claim 4, Column 9, Line 62, change "paris" to --pairs--;
Claim 4, Column 10, Line 4, change "paris" to --pairs--;

UNITED STATES PATENT AND TRADEMARK OFFICE
CERTIFICATE OF CORRECTION

PATENT NO. : 4,970,685
DATED : November 13, 1990
INVENTOR(S) : Masaru Koyanagi

It is certified that error appears in the above-identified patent and that said Letters Patent is hereby corrected as shown below:

Claim 4, Column 10, Line 9, change "paris" to --pairs--;

Claim 4, Column 10, Lines 11 & 12, change "amplifier" to --amplifiers--;

Claim 5, Column 10, Line 17, change "paris" to --pairs--;

Claim 5, Column 10, Line 26, change "paris" to --pairs-- {both occurrences};

Claim 5, Column 10, Line 28, change "paris" to --pairs--;

Claim 5, Column 10, Line 29, change "paris" to --pairs--;

Claim 5, Column 10, Line 34, change "paris" to --pairs--;

Claim 5, Column 10, Line 41, change "paris" to --pairs--;

Claim 6, Column 10, Line 49, change "paris" to --pairs--;

Claim 6, Column 10, Line 50, change "paris" to --pairs--;

Claim 6, Column 10, Line 52, change "paris" to --pairs--;

UNITED STATES PATENT AND TRADEMARK OFFICE
CERTIFICATE OF CORRECTION

PATENT NO. : 4,970,685
DATED : November 13, 1990
INVENTOR(S) : Masaru Koyanagi

It is certified that error appears in the above-identified patent and that said Letters Patent is hereby corrected as shown below:

Claim 6, Column 10, Line 53, change "paris" to --pairs--;

Claim 6, Column 10, Line 58, change "paris" to --pairs--.

Signed and Sealed this

Nineteenth Day of May, 1992

*Attest:*

DOUGLAS B. COMER

*Attesting Officer*    Acting Commissioner of Patents and Trademarks